United States Patent
Ding et al.

(10) Patent No.: US 11,271,187 B2
(45) Date of Patent: Mar. 8, 2022

(54) ARRAY SUBSTRATE, OLED DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Ding Ding, Wuhan (CN); Liang Fang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 203 days.

(21) Appl. No.: 16/624,090

(22) PCT Filed: Nov. 5, 2019

(86) PCT No.: PCT/CN2019/115509
§ 371 (c)(1),
(2) Date: Dec. 18, 2019

(87) PCT Pub. No.: WO2021/012461
PCT Pub. Date: Jan. 28, 2021

(65) Prior Publication Data
US 2021/0336220 A1    Oct. 28, 2021

(30) Foreign Application Priority Data

Jul. 24, 2019   (CN) .......................... 201910673178.5

(51) Int. Cl.
    H01L 51/52    (2006.01)
    H01L 27/32    (2006.01)
    H01L 51/00    (2006.01)

(52) U.S. Cl.
    CPC ...... *H01L 51/5259* (2013.01); *H01L 27/3276* (2013.01); *H01L 51/0097* (2013.01)

(58) Field of Classification Search
    None
    See application file for complete search history.

(56) References Cited

U.S. PATENT DOCUMENTS

2015/0123098 A1*  5/2015  Kang .................. H01L 27/3244
                                              257/40
2017/0331073 A1   11/2017  Choi et al.
(Continued)

FOREIGN PATENT DOCUMENTS

CN    108550612 A    9/2018
CN    110034159 A    7/2019

*Primary Examiner* — Evren Seven
(74) *Attorney, Agent, or Firm* — Osha Bergman Watanabe & Burton LLP

(57) ABSTRACT

Array substrate, an organic light emitting diode (OLED) display panel and a display device are provided with a flexible substrate, an water- and oxygen-resistant layer, a signal line layer and a flattening layer that are laminated in a bending region of the array substrate, signal transmission lines formed by patterning the signal line layer are formed on the water- and oxygen-resistant layer. By manufacturing the signal line layer of the bending region on the water- and oxygen-resistant layer and filling with the flattening layer, the problem of electrical performance of signal lines, caused by water and oxygen permeating the signal line layer through organic photoresist, is alleviated.

13 Claims, 3 Drawing Sheets

(56) References Cited

U.S. PATENT DOCUMENTS

| | | | |
|---|---|---|---|
| 2019/0044078 A1* | 2/2019 | Chen | H01L 51/5253 |
| 2019/0189720 A1 | 6/2019 | Lim et al. | |
| 2019/0259822 A1* | 8/2019 | Jeon | H01L 27/3262 |
| 2019/0326378 A1* | 10/2019 | Kim | H01L 27/3262 |
| 2020/0013844 A1* | 1/2020 | Cho | H05K 1/147 |
| 2020/0089368 A1* | 3/2020 | Shim | H01L 27/3276 |
| 2021/0257589 A1* | 8/2021 | Wang | H01L 51/56 |

* cited by examiner

ARRAY SUBSTRATE, OLED DISPLAY PANEL AND DISPLAY DEVICE

FIELD OF THE DISCLOSURE

The present application relates to display technologies, and more particularly to an array substrate, an organic light emitting diode (OLED) display panel and a display device.

DESCRIPTION OF RELATED ARTS

In existing display devices, in order to improve a screen ratio, a bending region is generally formed outside a display region and is bent toward a rear face of a panel at a stage of cell process. To increase bending durability, inorganic layers in the bending region are generally removed entirely to form openings which are filled by organic photoresist. After that, signal lines are deposited above the organic photoresist and are patterned, and then a flattening layer is deposited above the signal lines. As shown in FIG. 1, in this design, a signal line layer 30 in a bending region BA directly contacts an organic photoresist layer 20 which directly contacts a flexible substrate 10. This causes water and oxygen contained in the flexible substrate 10 to permeate the signal line layer 30 through the organic photoresist layer 20, thereby affecting electrical performance of the signal lines.

Accordingly, there is a need to solve the problems in the existing display devices.

SUMMARY

The present application provides an array substrate, an OLED display panel and a display device, for alleviating the technical problem of electrical performance of signal lines, caused by water and oxygen permeating a signal line layer through organic photoresist in existing display devices.

To solve above problems, the technical solutions provide in the present application are described below.

Embodiments of the present application provide an array substrate, including the following elements in a bending region:

a flexible substrate a water- and oxygen-resistant layer, formed on the flexible substrate;

a signal line layer, formed on the water- and oxygen-resistant layer and patterned to form signal transmission lines;

a flattening layer, formed on the signal line layer and the water- and oxygen-resistant layer.

In the array substrate provided in the embodiments of the present application, the bending region includes a first bending region and a second bending region;

wherein in the display region, the array substrate includes a barrier layer formed on the flexible substrate; and wherein the barrier layer extends to the first bending region to form the water- and oxygen-resistant layer.

In the array substrate provided in the embodiments of the present application, in the first bending region, film layer thickness of the water- and oxygen-resistant layer is less than film layer thickness of the barrier layer.

In the array substrate provided in the embodiments of the present application, the water- and oxygen-resistant layer is formed with a plurality of first slots in corresponding regions of the patterned signal line layer not forming the signal transmission lines, and the flattening layer fills the first slots.

In the array substrate provided in the embodiments of the present application, a part of or all of the first slots penetrate the barrier layer.

In the array substrate provided in the embodiments of the present application, the array substrate further includes a buffer layer formed on the barrier layer in the display region, wherein the barrier layer and the buffer layer extend to the second bending region to form the water- and oxygen-resistant layer.

In the array substrate provided in the embodiments of the present application, film layer thickness of the water- and oxygen-resistant layer in the second bending region is equal to a sum of film layer thickness of the barrier layer and film layer thickness of the buffer layer.

In the array substrate provided in the embodiments of the present application, the water- and oxygen-resistant layer is formed with a plurality of second slots in corresponding regions of the patterned signal line layer not forming the signal transmission lines, and the flattening layer fills the second slots.

In the array substrate provided in the embodiments of the present application, the depth of the second slots is less than film layer thickness of the buffer layer.

Embodiments of the present application further provide an OLED display panel, including:

an array substrate;

a light emitting functional layer, formed on the array substrate; and an encapsulating layer, formed on the light emitting functional layer.

In the OLED display panel provided in the embodiments of the present application, the array substrate includes the following elements in a bending region:

a flexible substrate a water- and oxygen-resistant layer, formed on the flexible substrate;

a signal line layer, formed on the water- and oxygen-resistant layer and patterned to form signal transmission lines;

a flattening layer, formed on the signal line layer and the water- and oxygen-resistant layer.

In the OLED display panel provided in the embodiments of the present application, the bending region includes a first bending region and a second bending region;

wherein in the display region, the array substrate includes a barrier layer formed on the flexible substrate; and wherein the barrier layer extends to the first bending region to form the water- and oxygen-resistant layer.

In the OLED display panel provided in the embodiments of the present application, in the first bending region, film layer thickness of the water- and oxygen-resistant layer is less than film layer thickness of the barrier layer.

In the OLED display panel provided in the embodiments of the present application, the water- and oxygen-resistant layer is formed with a plurality of first slots in corresponding regions of the patterned signal line layer not forming the signal transmission lines, and the flattening layer fills the first slots.

In the OLED display panel provided in the embodiments of the present application, a part of or all of the first slots penetrate the barrier layer.

In the OLED display panel provided in the embodiments of the present application, the array substrate further includes a buffer layer formed on the barrier layer in the display region, wherein the barrier layer and the buffer layer extend to the second bending region to form the water- and oxygen-resistant layer.

In the OLED display panel provided in the embodiments of the present application, film layer thickness of the water- and oxygen-resistant layer in the second bending region is equal to a sum of film layer thickness of the barrier layer and film layer thickness of the buffer layer.

In the OLED display panel provided in the embodiments of the present application, the water- and oxygen-resistant layer is formed with a plurality of second slots in corresponding regions of the patterned signal line layer not forming the signal transmission lines, and the flattening layer fills the second slots.

In the OLED display panel provided in the embodiments of the present application, the depth of the second slots is less than film layer thickness of the buffer layer.

Embodiments of the present application further provide a display device including the OLED display panel provided in embodiments of the present application.

Beneficial effects of the present application are described below. The present application provides an array substrate, an OLED display panel and a display device. In the bending region, the array substrate includes the flexible substrate, the water- and oxygen-resistant layer, the signal line layer and the flattening layer that are laminated. The signal transmission lines formed by patterning the signal line layer is formed on the water- and oxygen-resistant layer. The bending region includes a first bending region and a second bending region. The water- and oxygen-resistant layer forms first slots in the first bending region and forms second slots in the second bending region. The flattening layer fills the first slots and the second slots. By manufacturing the signal line layer of the bending region on the water- and oxygen-resistant layer and filling with the flattening layer, the present application alleviates the problem of electrical performance of signal lines, caused by water and oxygen permeating the signal line layer through organic photoresist.

DESCRIPTION OF DRAWINGS

For explaining the technical solutions used in the existing arts or the embodiments more clearly, the appended figures to be used in describing the existing arts or the embodiments will be briefly introduced in the following. Obviously, the appended figures described below are only some of the embodiments of the invention, and those of ordinary skill in the art can further obtain other figures according to these figures without making any inventive effort.

DETAILED DESCRIPTION

The following descriptions for the respective embodiments are specific embodiments capable of being implemented for illustrations of the present application with referring to the appended figures. In describing the present application, spatially relative terms such as "upper", "lower", "front", "back", "left", "right", "inner", "outer", "lateral", and the like, may be used herein for ease of description as illustrated in the figures. Therefore, the spatially relative terms used herein are intended to illustrate the present application for ease of understanding, but are not intended to limit the present application. In the appended figures, units with similar structures are indicated by same reference numbers.

Embodiments of the present application can alleviate the technical problem of electrical performance of signal lines, caused by water and oxygen permeating the signal lines through organic photoresist in the existing art.

Figure 1:
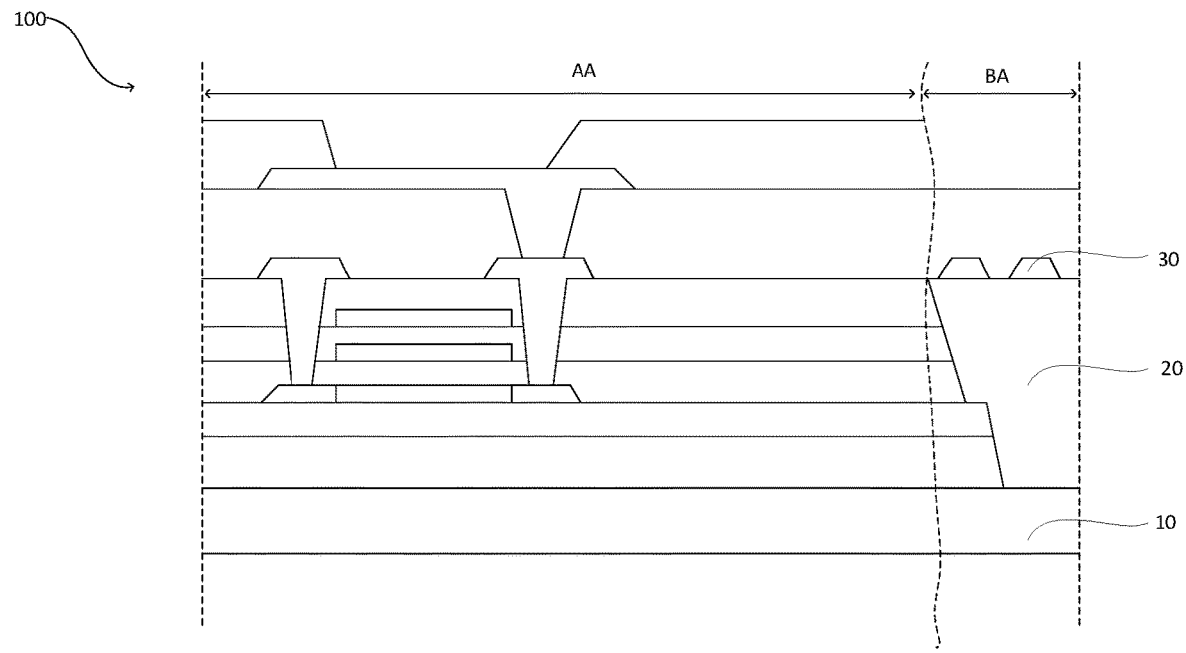
FIG. 1 is a schematic diagram showing a film layer structure of an array substrate in an existing art.
Figure 2:
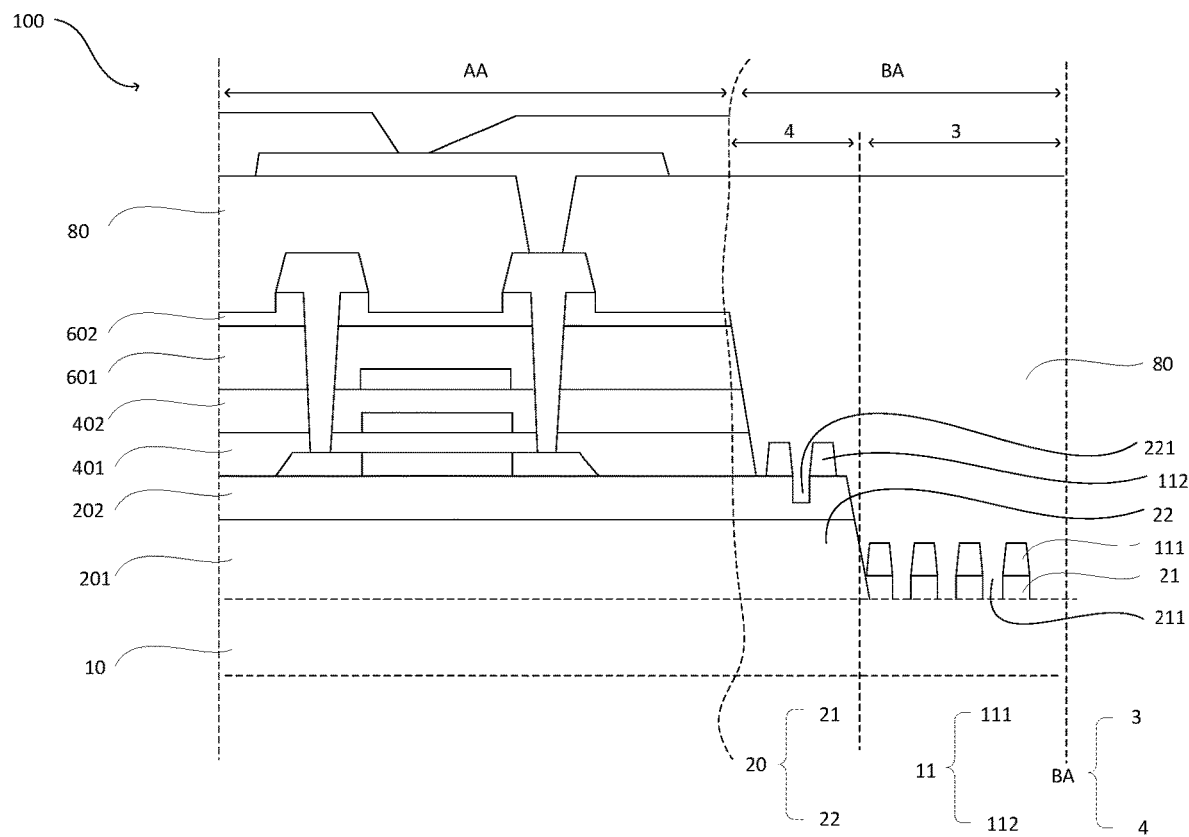
FIG. 2 is a schematic diagram illustrating a film layer structure according to a first embodiment provided in embodiments of the present application.

As shown in FIG. 2, in an bending region BA of an array substrate 100, the array substrate 100 provided in the present embodiment includes:

a flexible substrate 10;

a water- and oxygen-resistant layer 20, formed on the flexible substrate 10;

a signal line layer 11, formed on the water- and oxygen-resistant layer 20 and patterned to form signal transmission lines 111 and 112;

a flattening layer 80, formed on the signal line layer 11 and the water- and oxygen-resistant layer 20.

The present embodiment provides the array substrate which includes the flexible substrate, the water- and oxygen-resistant layer, the signal line layer and the flattening layer that are laminated in the bending region. The signal transmission line formed by patterning the signal line layer is formed on the water- and oxygen-resistant layer. The bending region includes a first bending region and a second bending region. The water- and oxygen-resistant layer has a plurality of first slots formed in the first bending region and a plurality of second slots formed in the second bending region. The flattening layer fills the first slots and the second slots. In the present application, the signal line layer of the bending region is fabricated on the water- and oxygen-resistant layer and is filled with the flattening layer. This alleviates the problem of signal line performance, caused by water and oxygen permeating the signal line layer through organic photoresist.

In an embodiment, as shown in FIG. 2, in the bending region BA, the array substrate 100 includes:

a flexible substrate 10;

a water- and oxygen-resistant layer 20 formed on the flexible substrate 10;

a signal line layer 11 formed on the water- and oxygen-resistant layer 20, the signal line layer 11 patterned to form signal transmission lines 111 and 112;

a flattening layer 80 formed on the signal line layer 11 and the water- and oxygen-resistant layer 20.

In an embodiment, the material of the flexible substrate 10 can be a flexible polymer such as polyimide.

In an embodiment, the bending region BA includes a first bending region 3 and a second bending region 4. A plurality of signal transmission lines 112 are disposed in the second bending region 4, distributed as a fan, and configured to connect traces in a display area to a driving circuit located in a peripheral area. Likewise, signal transmission lines 111 are disposed in the first bending region 3 and configured to connect a peripheral driving chip.

In an embodiment, in a display region AA, the array substrate 100 includes a barrier layer 201 formed on the flexible substrate 10 and a buffer layer 202 formed on the barrier layer 201.

In an embodiment, the material of the barrier layer 201 may include silicon oxide, which is primarily configured to prevent impurities in the flexible substrate 10 from spreading out and prevent invasion of outer water and oxygen.

In an embodiment, the material of the buffer layer 202 may include any one of silicon nitride and silicon oxide or their composition, which is primarily configured to buffer the pressure between film layer structures and may has a certain degree of ability to block water and oxygen.

In an embodiment, the barrier layer 201 in the display region AA extends to the first bending region 3 to form the water- and oxygen-resistant layer 21.

In an embodiment, film layer thickness of the water- and oxygen-resistant layer 21 is less than film layer thickness of the barrier layer 201.

In an embodiment, the water- and oxygen-resistant layer 21 may also be disposed individually without a need to extend the barrier layer 201 to the first bending region 3.

In an embodiment, in the first bending region 3, the water- and oxygen-resistant layer 21 is formed with a plurality of first slots 211 in corresponding regions of the patterned signal line layer 11 not forming the signal transmission lines 111. The flattening layer 80 fills the first slots 211.

In an embodiment, a part of or all of the first slots 211 penetrates the water- and oxygen-resistant layer 21 such that a part of the flattening layer 80 directly contacts the flexible substrate 10, thereby improving bending performance of the array substrate.

In an embodiment, the signal transmission lines 111 disposed on the water- and oxygen-resistant layer 21 are primarily configured to connect source signal lines, gate scan lines and power lines in the display region AA to an external driving chip.

In an embodiment, the barrier layer 201 and the buffer layer 202 in the display region AA extend to the second bending region 4 to form the water- and oxygen-resistant layer 22.

In an embodiment, film layer thickness of the water- and oxygen-resistant layer 22 is equal to a sum of film layer thickness of the barrier layer 201 and film layer thickness of the buffer layer 202.

In an embodiment, film layer thickness of the water- and oxygen-resistant layer 22 may also be less than a sum of film layer thickness of the barrier layer 201 and film layer thickness of the buffer layer 202.

In an embodiment, the water- and oxygen-resistant layer 22 may also be disposed individually without a need to extend the barrier layer 201 and the buffer layer 202 to the first bending region 3.

In an embodiment, the water- and oxygen-resistant layer 22 and the water- and oxygen-resistant layer 21 have different layer profiles. This is primarily for reducing a stage difference.

In an embodiment, in the second bending region 4, the water- and oxygen-resistant layer 22 is formed with a plurality of second slots 221 in corresponding regions of the patterned signal line layer 11 not forming the signal transmission lines 112. The flattening layer 80 fills the second slots 221.

In an embodiment, the depth of the second slots 221 is less than film layer thickness of the buffer layer 202. The second slots 221 are primarily configured to enhance bending performance of the array substrate.

In an embodiment, the depth of the second slots 221 may also be equal to film layer thickness of the buffer layer 202.

In an embodiment, the depth of the second slots 221 may also be greater than film layer thickness of the buffer layer 202.

In an embodiment, the signal transmission lines 112 disposed on the water- and oxygen-resistant layer 22 are primarily connected to the source signal lines, the gate scan lines and the power lines in the display region.

Figure 3:
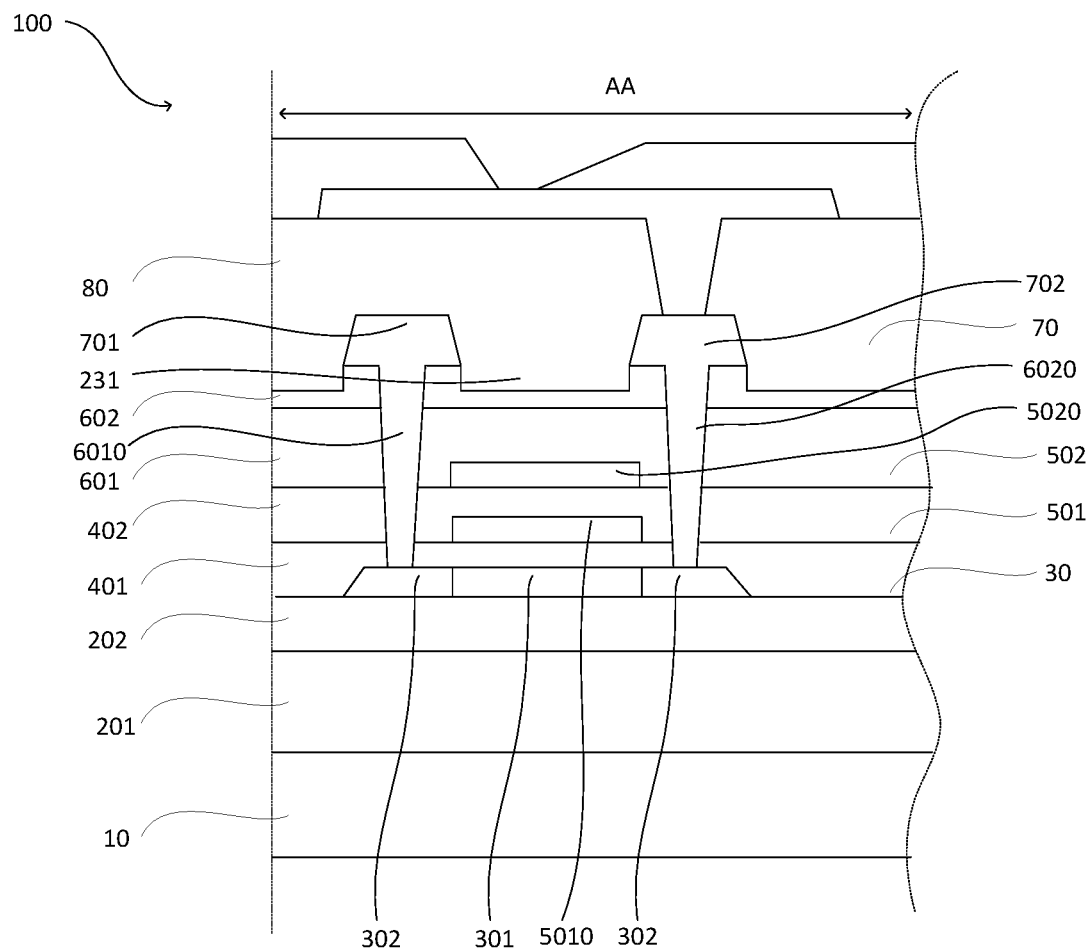
FIG. 3 is a schematic diagram illustrating a film layer structure in a display region provided in embodiments of the present application.

In an embodiment, as shown in FIG. 3, the display region AA further includes an active layer 20, a first gate insulating layer 401, a first gate electrode layer 501, a second gate insulating layer 402, a second gate electrode layer 502, a first insulating interlayer 601, a second insulating interlayer 602, a source drain electrode layer 70 and the flattening layer 80 that are laminated.

In an embodiment, the first gate electrode layer 501 and the second gate electrode layer 502 are patterned to form a first electrode plate 5010 and a second electrode plate 5020, respectively, which for a storage capacitor.

In an embodiment, the material of the gate electrode layer 40 may generally be any one of molybdenum, aluminum, aluminum-nickel alloy, molybdenum-tungsten alloy, chromium and copper, or a composition of several metal materials described above.

In an embodiment, the active layer 30 is patterned to form a channel region 301 and doped regions 302 and 303 located at two sides of the channel region 301. The doped regions 302 and 303 may be formed by ion doping at two sides of the channel region 301 with the first electrode plate 5010, formed by patterning the first gate electrode layer 501, that shields the channel region 301.

In an embodiment, the insulating interlayer 60 consists of two layers, in which the first insulating interlayer 601 provides the needed thickness of dielectric layer in general process and the second insulating interlayer 602 is an anti-etching layer that needs to be added. The contact interface materials of the two layers may be the same or different.

In an embodiment, the material of the insulating interlayer may be silicon nitride or silicon oxide, or their combination.

In an embodiment, as shown in FIGS. 2 and 3, the insulating interlayer 60 is patterned to form vias 6010 and 6020 in the display region and form openings (not shown) in the bending region.

In an embodiment, openings are formed in the bending region (not shown). The openings penetrate from the insulating interlayer 60 to the buffer layer 202 and the barrier layer 201.

In an embodiment, the source drain electrode layer 70 is patterned to form a source electrode 701 and a drain electrode 702 in the display region AA and form the signal transmission lines 111/112 in the bending region BA. The source electrode 701 is connected to the doped region 302 through the via 6010 and the source electrode 702 is connected to the doped region 303 through the via 6020.

In an embodiment, the source drain electrode layer 70 is further patterned to form slots including the first slots 211 and the second slots 221 formed in the bending region BA and a third slots 231 formed in the display region.

In an embodiment, the depth of the third slot 231 may be less than or greater than film layer thickness of the second insulating interlayer 602.

In an embodiment, the third slot 231 plays a role in reducing the thickness of film layers of the array substrate.

Figure 4:
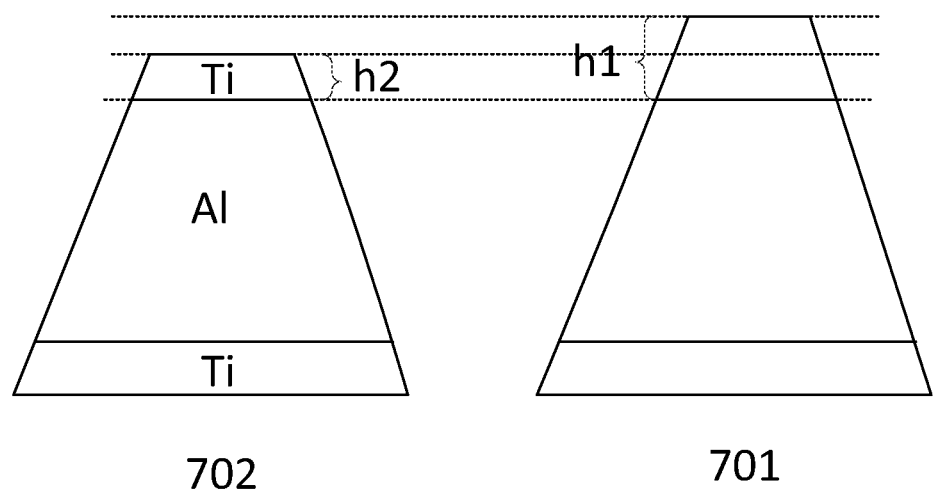
FIG. 4 is a contrast structural diagram of a source electrode and a drain electrode according to embodiments of the present application.

In an embodiment, as shown in FIG. 4, the source drain electrode layer 70 is a sandwich structure made by Ti/Al/Ti, in which the initial thickness of a third film layer Ti is h1. The thickness of the third film layer Ti of the source electrode 701 is h1 and the thickness of the third film layer Ti of the drain electrode 702 is h2, where h1 is greater than h2. As to the signal transmission lines in the bending region BA, the thickness of the third film layer Ti is equal to the initial thickness h1.

Figure 5:
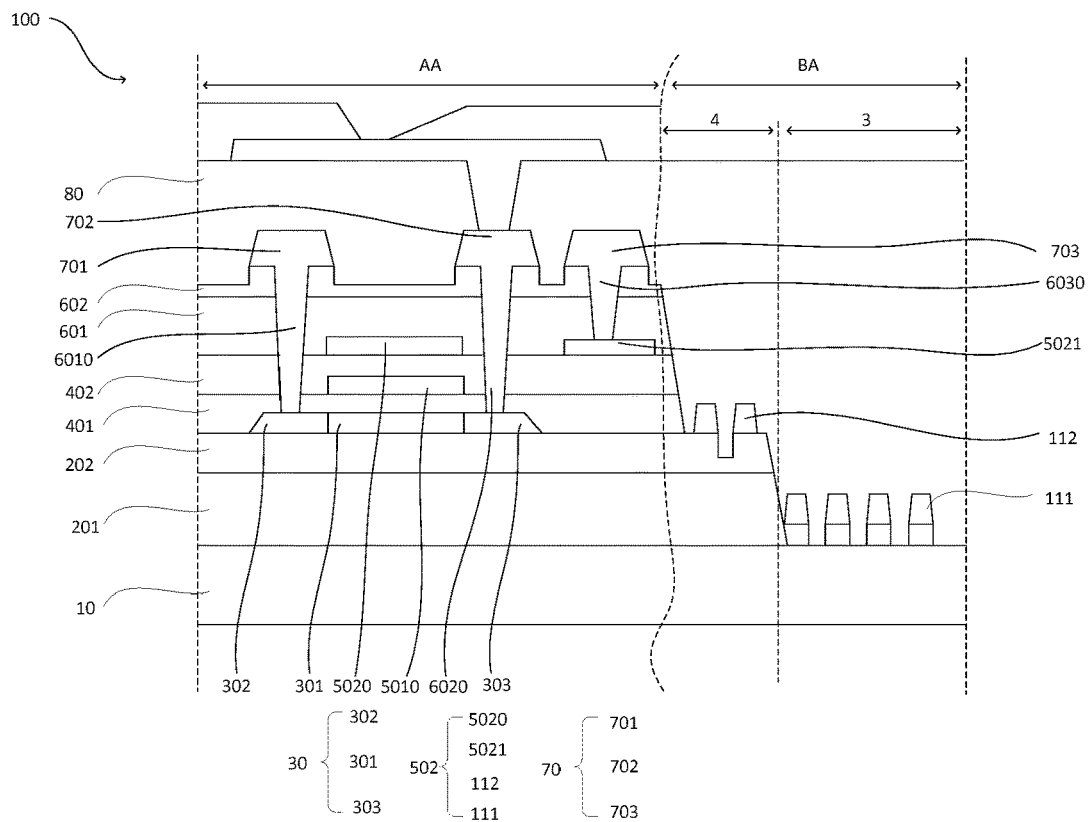
FIG. 5 is a schematic diagram illustrating a film layer structure according to a second embodiment provided in embodiments of the present application.

In an embodiment, as shown in FIG. 5, the array substrate 100 includes a display region AA and a bending region BA. The display region AA includes a flexible substrate 10, a barrier layer 201, a buffer layer 202, an active layer 30, a first gate insulating layer 401, a first gate electrode layer 501, a second gate insulating layer 402, a second gate electrode layer 502, a first insulating interlayer 601, a second insulating interlayer 602, a source drain electrode layer 70 and the flattening layer 80 that are laminated.

In an embodiment, the first gate electrode layer 501 is patterned to form a first electrode plate 5010 and the second gate electrode layer 502 is patterned to form a second electrode plate 5020. A storage capacitor is formed between the first electrode plate 5010 and the second electrode plate 5020.

In an embodiment, the second gate electrode layer 502 is patterned to form signal transmission lines 5021 in the display region AA and form signal transmission lines 111 and 112 in the bending region BA.

In an embodiment, the active layer 30 is patterned to form a channel region 301 and doped regions 302 and 303 located at two sides of the channel region. The doped regions 302 and 303 may be formed by ion doping at two sides of the channel region 301 with the first electrode plate 5010, formed by patterning the first gate electrode layer 501, that shields the channel region 301.

In an embodiment, the insulating interlayer 60 consists of two layers, in which the first insulating interlayer 601 provides the needed thickness of dielectric layer in general process and the second insulating interlayer 602 is an anti-etching layer that needs to be added. The contact interface materials of the two layers may be the same or different.

In an embodiment, the insulating interlayer is patterned to form a first via 6010, a second via 6020 and a third via 6030.

In an embodiment, the material of the insulating interlayer may be silicon nitride or silicon oxide, or their combination.

In an embodiment, the source drain electrode layer 70 is patterned to form a source electrode 701, a drain electrode 702 and a data line 703.

In an embodiment, the source electrode 701 is connected to the doped region 302 through the first via 6010, the drain electrode 702 is connected to the doped region 303 through the second via 6020 and the data line 703 is connected to the signal transmission line 5021 through the third via 6030.

Figure 6:
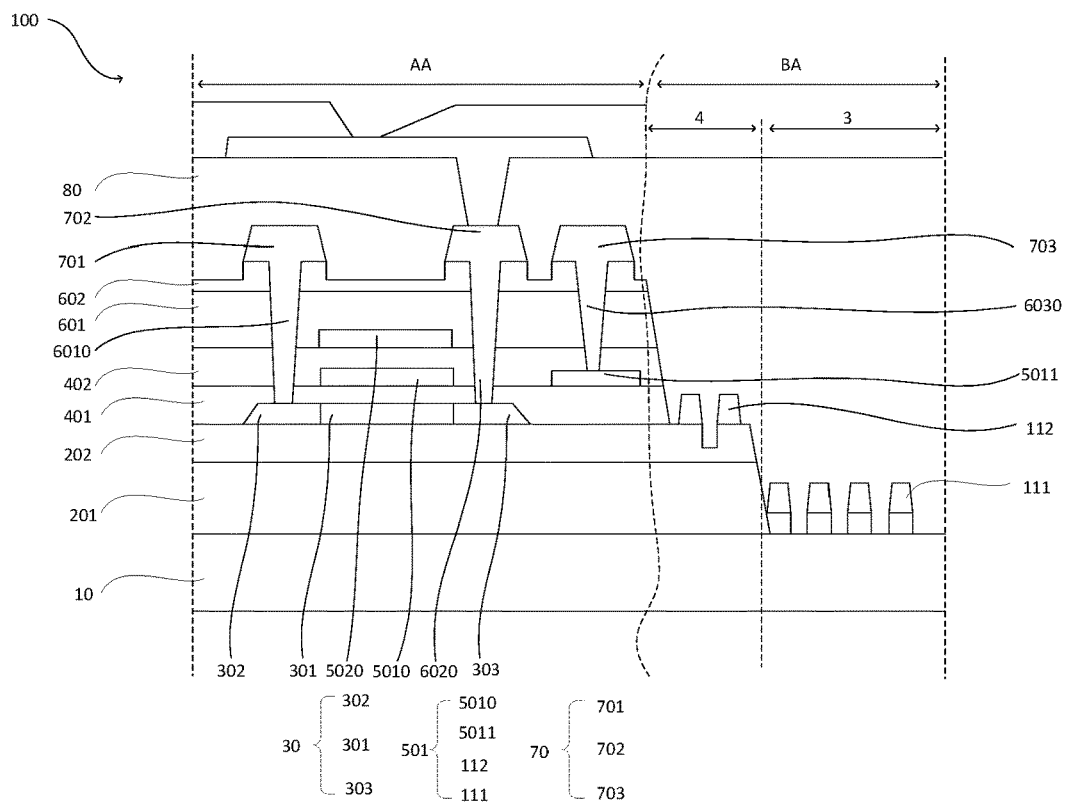
FIG. 6 is a schematic diagram illustrating a film layer structure according to a third embodiment provided in embodiments of the present application.

In an embodiment, as shown in FIG. 6, the array substrate 100 includes a display region AA and a bending region BA. The display region AA includes a flexible substrate 10, a barrier layer 201, a buffer layer 202, an active layer 30, a first gate insulating layer 401, a first gate electrode layer 501, a second gate insulating layer 402, a second gate electrode layer 502, a first insulating interlayer 601, a second insulating interlayer 602, a source drain electrode layer 70 and the flattening layer 80 that are laminated.

In an embodiment, the first gate electrode layer 501 is patterned to form a first electrode plate 5010 and the second gate electrode layer 502 is patterned to form a second electrode plate 5020. A storage capacitor is formed between the first electrode plate 5010 and the second electrode plate 5020.

In an embodiment, the first gate electrode layer 501 is patterned to form signal transmission lines 5011 in the display region AA and form signal transmission lines 111 and 112 in the bending region BA.

In an embodiment, the active layer 30 is patterned to form a channel region 301 and doped regions 302 and 303 located at two sides of the channel region. The doped regions 302 and 303 may be formed by ion doping at two sides of the channel region 301 with the first electrode plate 5010, formed by patterning the first gate electrode layer 501, that shields the channel region 301.

In an embodiment, the insulating interlayer 60 consists of two layers, in which the first insulating interlayer 601 provides the needed thickness of dielectric layer in general process and the second insulating interlayer 602 is an anti-etching layer that needs to be added. The contact interface materials of the two layers may be the same or different.

In an embodiment, the insulating interlayer is patterned to form a first via 6010, a second via 6020 and a third via 6030.

In an embodiment, the material of the insulating interlayer may be silicon nitride or silicon oxide, or their combination.

In an embodiment, the source drain electrode layer 70 is patterned to form a source electrode 701, a drain electrode 702 and a data line 703.

In an embodiment, the source electrode 701 is connected to the doped region 302 through the first via 6010, the drain electrode 702 is connected to the doped region 303 through the second via 6020 and the data line 703 is connected to the signal transmission line 5011 through the third via 6030.

In order to manufacture the array substrate shown in FIG. 2, the embodiments of the present application further provide a method for manufacturing an array substrate, which includes steps of:

S1: providing a flexible substrate and sequentially depositing a barrier layer and a buffer layer on the flexible substrate;

S2: depositing an active layer on the buffer layer, wherein the active layer is patterned to form doped regions and a channel region;

S3: forming a first gate insulating layer on the active layer, forming a first gate electrode layer on the first gate insulating layer and patterning the first gate electrode layer, forming the doped regions by ion doping for other regions except for the channel region by use of the patterned first gate electrode layer;

S4: forming a second gate insulating layer on the first gate electrode layer and the first gate insulating layer, wherein a second gate electrode layer is formed on the second gate insulating layer and is patterned;

S5: sequentially depositing a first insulating interlayer and a second insulating interlayer on the second gate electrode layer and the second gate insulating layer and patterning the first insulating interlayer and the second insulating interlayer to form vias used to connect to the doped regions in the display region and form a first opening and a second opening in the bending region, wherein the first opening penetrates toward the buffer layer to form a water- and oxygen-resistant layer of a second bending region and the second opening penetrates from the buffer layer to the barrier layer to form a water- and oxygen-resistant layer of a first bending region;

S6: depositing a source drain electrode layer consisting of three layers (Ti—Al—Ti) on the insulating interlayer and patterning the source drain electrode layer to form a source electrode and a drain electrode that connect to the doped regions in the display region, and form signal transmission lines in the bending region, wherein the thickness of a third film layer Ti of the signal transmission lines in the bending region is equal to the thickness of a third film layer Ti of the source electrode in the display region;

S7: in a case that photoresist is not removed after the source drain electrode layer is patterned, forming a first slot in the display region with a depth less than or greater than film layer thickness of the second insulating interlayer, forming second slots and third slots in the bending region, wherein the second slots are located in the second bending region and the depth of the second slots is less than film layer thickness of the water- and oxygen-resistant layer, wherein the third slots are located in the first bending region, and a part of or all of the third slots penetrate the water- and oxygen-resistant layer;

S8: depositing a flattening layer, wherein the flattening layer in the display region is formed on the source drain electrode layer and the insulating interlayer and is patterned to form a via for connecting to the drain electrode, wherein the flattening layer in the bending region is manufactured on the signal transmission lines and the water- and oxygen-resistant layer and fills the slots of the water- and oxygen-resistant layer.

The embodiments of the present application further provide an organic light emitting diode (OLED) display panel. The OLED display panel includes an array substrate, a light emitting functional layer manufactured on the array substrate and an encapsulating layer manufactured on the functional layer.

In an embodiment, in a bending region, the array substrate includes:
a flexible substrate
a water- and oxygen-resistant layer, formed on the flexible substrate;
a signal line layer, formed on the water- and oxygen-resistant layer and patterned to form signal transmission lines;
a flattening layer, formed on the signal line layer and the water- and oxygen-resistant layer.

In an embodiment, the bending region includes a first bending region and a second bending region. In a display region, the array substrate includes a barrier layer formed on the flexible substrate. The barrier layer extends to a part of the first bending region to form the water- and oxygen-resistant layer.

In an embodiment, in the first bending region, film layer thickness of the water- and oxygen-resistant layer is less than film layer thickness of the barrier layer.

In an embodiment, the water- and oxygen-resistant layer is formed with a plurality of first slots in corresponding regions of the patterned signal line layer not forming the signal transmission lines. The flattening layer fills the first slots.

In an embodiment, a part of or all of the first slots penetrate the barrier layer.

In an embodiment, in the display region, the array substrate further includes a buffer layer formed on the barrier layer.

wherein the barrier layer and the buffer layer extend to the second bending region to form the water- and oxygen-resistant layer.

In an embodiment, film layer thickness of the water- and oxygen-resistant layer in the second bending region is equal to a sum of film layer thickness of the barrier layer and film layer thickness of the buffer layer.

In an embodiment, the water- and oxygen-resistant layer is formed with second slots in corresponding regions of the patterned signal line layer not forming the signal transmission lines. The flattening layer fills the second slots.

In an embodiment, the depth of the second slots is less than film layer thickness of the buffer layer.

In an embodiment, the light emitting functional layer includes a pixel electrode layer, pixel definition layer, a luminescent material layer and a common electrode layer.

In an embodiment, the common electrode layer is a a transparent conductive metal layer.

Embodiments of the present application further provide a display device including the OLED display panel according to above embodiments.

It can be known from above embodiments that:

The present application provides an array substrate and a manufacturing method thereof, an OLED display panel and a display device. In the bending region, the array substrate includes the flexible substrate, the water- and oxygen-resistant layer, the signal line layer and the flattening layer that are laminated. The signal transmission lines formed by patterning the signal line layer is formed on the water- and oxygen-resistant layer. The bending region includes a first bending region and a second bending region. The water- and oxygen-resistant layer forms first slots in the first bending region and forms second slots in the second bending region. The flattening layer fills the first slots and the second slots. By manufacturing the signal line layer of the bending region on the water- and oxygen-resistant layer and filling with the flattening layer, the present application alleviates the problem of electrical performance of signal lines, caused by water and oxygen permeating the signal line layer through organic photoresist.

While the preferred embodiments of the present application have been illustrated and described in detail, various modifications and alterations can be made by persons skilled in this art. The embodiment of the present application is therefore described in an illustrative but not restrictive sense. It is intended that the present application should not be limited to the particular forms as illustrated, and that all modifications and alterations which maintain the spirit and realm of the present application are within the scope as defined in the appended claims.

The invention claimed is:

1. An array substrate, comprising the following elements in a bending region:
a flexible substrate
a water- and oxygen-resistant layer, formed on the flexible substrate;
a signal line layer, formed on the water- and oxygen-resistant layer and patterned to form signal transmission lines;
a flattening layer, formed on the signal line layer and the water- and oxygen-resistant layer,
wherein the bending region comprises a first bending region and a second bending region;
wherein in the display region, the array substrate comprises a barrier layer formed on the flexible substrate; and
wherein the barrier layer extends to the first bending region to form the water- and oxygen-resistant layer,
wherein the array substrate further comprises a buffer layer formed on the barrier layer in the display region,
wherein the barrier layer and the buffer layer extend to the second bending region to form the water- and oxygen-resistant layer,
wherein film layer thickness of the water- and oxygen-resistant layer in the second bending region is equal to a sum of film layer thickness of the barrier layer and film layer thickness of the buffer layer.

2. The array substrate according to claim 1, wherein in the first bending region, film layer thickness of the water- and oxygen-resistant layer is less than film layer thickness of the barrier layer.

3. The array substrate according to claim 2, wherein the water- and oxygen-resistant layer is formed with a plurality of first slots in corresponding regions of the patterned signal line layer not forming the signal transmission lines, and the flattening layer fills the first slots.

4. The array substrate according to claim 3, wherein a part of or all of the first slots penetrate the barrier layer.

5. The array substrate according to claim 1, wherein the water- and oxygen-resistant layer is formed with a plurality of second slots in corresponding regions of the patterned signal line layer not forming the signal transmission lines, and the flattening layer fills the second slots.

6. The array substrate according to claim 5, wherein the depth of the second slots is less than film layer thickness of the buffer layer.

7. An organic light emitting diode (OLED) display panel, comprising:
   an array substrate;
   a light emitting functional layer, formed on the array substrate; and
   an encapsulating layer, formed on the light emitting functional layer, wherein the array substrate comprises the following elements in a bending region:
   a flexible substrate
   a water- and oxygen-resistant layer, formed on the flexible substrate;
   a signal line layer, formed on the water- and oxygen-resistant layer and patterned to form signal transmission lines;
   a flattening layer, formed on the signal line layer and the water- and oxygen-resistant layer,
   wherein the bending region comprises a first bending region and a second bending region;
   wherein in the display region, the array substrate comprises a barrier layer formed on the flexible substrate; and
   wherein the barrier layer extends to the first bending region to form the water- and oxygen-resistant layer,
   wherein the array substrate further comprises a buffer layer formed on the barrier layer in the display region,
   wherein the barrier layer and the buffer layer extend to the second bending region to form the water- and oxygen-resistant layer,
   wherein film layer thickness of the water- and oxygen-resistant layer in the second bending region is equal to a sum of film layer thickness of the barrier layer and film layer thickness of the buffer layer.

8. The OLED display panel according to claim 7, wherein in the first bending region, film layer thickness of the water- and oxygen-resistant layer is less than film layer thickness of the barrier layer.

9. The OLED display panel according to claim 8, wherein the water- and oxygen-resistant layer is formed with a plurality of first slots in corresponding regions of the patterned signal line layer not forming the signal transmission lines, and the flattening layer fills the first slots.

10. The OLED display panel according to claim 9, wherein a part of or all of the first slots penetrate the barrier layer.

11. The OLED display panel according to claim 7, wherein the water- and oxygen-resistant layer is formed with a plurality of second slots in corresponding regions of the patterned signal line layer not forming the signal transmission lines, and the flattening layer fills the second slots.

12. The OLED display panel according to claim 11, wherein the depth of the second slots is less than film layer thickness of the buffer layer.

13. A display device, comprising the OLED display panel according to claim 7.

* * * * *